United States Patent
Miyajima et al.

(10) Patent No.: US 6,521,933 B2
(45) Date of Patent: Feb. 18, 2003

(54) SEMICONDUCTOR DEVICE AND METHOD OF MANUFACTURING THE SAME

(75) Inventors: Takashi Miyajima, Hyogo (JP); Masahiko Takeuchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/725,852

(22) Filed: Nov. 30, 2000

(65) Prior Publication Data

US 2001/0048104 A1 Dec. 6, 2001

(30) Foreign Application Priority Data

May 30, 2000 (JP) .......................... 2000-160022

(51) Int. Cl.⁷ .......................................... H01L 27/108
(52) U.S. Cl. ...................................... 257/296
(58) Field of Search .................... 438/14; 257/296, 257/306, 206; 365/201, 230.01, 175

(56) References Cited

U.S. PATENT DOCUMENTS 5,303,193 A * 4/1994 Ogihara ...................... 365/201
6,291,846 B1 * 9/2001 Ema ............................ 257/296

FOREIGN PATENT DOCUMENTS

JP 11-214671 8/1999

* cited by examiner

*Primary Examiner*—John F. Niebling
*Assistant Examiner*—André C Stevenson
(74) *Attorney, Agent, or Firm*—McDermott, Will & Emery

(57) ABSTRACT

In the drawn-out interconnection structure of the present invention, a storage node (SN) groove extending from a region, and a groove-shape drawn-out electrode is formed on the inner wall of storage node (SN) groove. An extended pad electrode portion extending from groove-shape drawn-out electrode is provided above storage node (SN) groove. Also provided is a contact plug that penetrates through extended pad electrode portion and that connects aluminum interconnection and extended pad electrode portion in a layer above extended pad electrode portion. With this arrangement, the structure of an interconnection drawn from an electrode of a semiconductor device can be obtained which allows the production of a cell transistor TEG capable of performing a reliable and stable measurement of the cell transistor characteristics.

10 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device, and more specifically, to an interconnection structure of a semiconductor device provided with a test element group for measuring the characteristics of a cell transistor of the semiconductor device.

2. Description of the Background Art

As semiconductor devices are developed with higher degrees of integration, increased storage capacity of the semiconductor devices is required while the chip sizes are being reduced. Consequently, the semiconductor device structures are becoming increasingly complex in the recent years.

On the other hand, semiconductor devices in the course of their development are provided with a test element group (hereinafter referred to as a TEG) for evaluating circuits, devices, processes and the like. When providing a cell transistor TEG for evaluating a cell transistor of a semiconductor device, for instance, the electrical contact interconnection is drawn from a storage node provided in the cell transistor.

Due to the increasing complexity of the semiconductor device structures in the recent years noted above, the structures of storage nodes are becoming more complex, and so are the methods of manufacturing them.

Despite the increasing complexities in the structures of the semiconductor devices and the methods of manufacturing them, however, the evaluation of a cell transistor TEG must be performed accurately. Thus, a structure of an interconnection drawn from an electrode of a semiconductor device for providing a cell transistor TEG becomes important.

Prior Art Arrangement

FIG. 23 shows a cross sectional structure of a cell transistor TEG provided for a cell transistor having a conventional thick film stacked capacitor structure. In the structure of this cell transistor TEG, an active region 20 defining a source/drain region and an element isolating oxide film 30 are provided in the prescribed region of the main surface of a silicon substrate 100 which is the semiconductor substrate.

A transfer gate 1B is provided on silicon substrate 100 with a gate insulating film 1A provided therebetween. Transfer gate 1B is covered by a nitride film 1D and a TEOS (Tetra Ethyl Ortho Silicate) film 1C.

A bit line (BL) 2 is connected via a bit line contact plug 4B to one of the active regions 20, and a storage node (SN electrode) 5 is connected via a storage node contact (SC) plug 4S to another of the active regions 20. In addition, transfer gate 1B, nitride film 1D, TEOS film 1C, and bit line (BL) 2 are covered by an interlayer BPTEOS (Boro Phospho Tetra Ethyl Ortho Silicate) film 3.

On the planarized interlayer BPTEOS film 3, storage node electrode 5 is provided which is formed by depositing doped polysilicon of 500 nm in film thickness, forming a thick film stacked capacitor structure. Storage node electrode 5 is covered by an interlayer contact film 6 formed of a TEOS film.

A contact plug 7 formed of tungsten and aluminum interconnection 8 electrically connected to storage node electrode 5 by contact plug 7 are provided to storage node electrode 5. In addition, the cell transistor TEG having the above-described arrangement is formed based on the same steps as a transistor in the memory cell region by the DRAM (Dynamic Random Access Memory) manufacturing techniques.

Here, in the cell transistor TEG formed by the above-described structure, since storage node electrode 5 has a thick film stacked structure with the doped polysilicon deposited to the thickness of 500 nm as shown in FIG. 23, when a contact hole 6a for providing a tungsten plug 7 is formed in interlayer film 6 by etching, contact hole 6a never penetrates through storage node electrode 5. As a result, the reliable formation of interconnections on the storage node side of cell transistor TEG can be ensured.

As described above, when manufacturing the cell transistor TEG formed based on the same steps as the transistor of the memory cell region by DRAM manufacturing techniques, since the film thickness of doped polysilicon that forms storage node electrode 5 is as thick as 500 nm in a conventional thick film stacked capacitor structure, contact hole 6a formed by etching does not penetrate through storage node electrode 5, and thus, tungsten plug 7 for cell transistor TEG and aluminum interconnection 8 can be provided.

In order to produce a capacitor with a large capacity, however, when a cylindrical structure is employed as a storage node structure instead of the thick film stacked capacitor structure, the film thickness of doped polysilicon forming storage node electrode 5 is reduced to 50 nm, which is approximately one-tenth of the thickness found in the conventional structure. As a result, a reliable contact in the storage node side cannot be ensured when the interconnection structure for the conventional cell transistor TEG is employed.

SUMMARY OF THE INVENTION

An object of the present invention is to provide a semiconductor device and a manufacturing method thereof which provide a structure of an interconnection drawn from an electrode of a semiconductor device that allows the production of a cell transistor TEG capable of performing a stable and reliable measurement of the characteristics of a cell transistor.

According to one aspect of the semiconductor device based on the present invention, the semiconductor device provided with a cell transistor test element group TEG having a cell transistor region and an interconnection region has a connecting structure for electrically connecting the interconnection region with a cylindrical storage node electrode provided in the cell transistor region, where the cell transistor region and the interconnection region are disposed in different regions in plan view, and the connecting structure has a groove-shape drawn-out electrode along a sidewall of a groove portion.

By employing the groove-shape drawn-out electrode connected to the cylindrical storage node electrode, the groove-shape electrode is drawn out to the vicinity of the interconnection region. Thus, even in the case of the cell transistor test element group of a cell transistor using the cylindrical capacitor structure, a reliable contact between the cylindrical storage node electrode and the interconnection region can be ensured via the groove-shape electrode which is in contact with the cylindrical storage node electrode. As a result, the test element group can be used to measure the transistor characteristics in a stable manner.

In addition, in the above invention, the connecting structure preferably includes an extended pad electrode portion extending from the groove-shape drawn-out electrode above the groove portion, and a contact plug which penetrates through the extended pad electrode portion and which connects the extended pad electrode portion with the interconnection region provided in a layer above the groove-shape drawn-out electrode.

With this arrangement, a sidewall of the contact plug is reliably connected with the extended pad electrode portion, and the reliable electrical connection can be established between the groove-shape electrode (which is connected to the extended pad electrode portion) with which the cylindrical storage node electrode makes contact and the interconnection region (which is connected to the contact plug). As a result, the measurement of the transistor characteristics can be performed in a stable manner.

Moreover, in the above invention, the connecting structure preferably includes a conductive layer disposed in a layer below the groove-shape drawn-out electrode, a first contact plug for connecting the groove-shape drawn-out electrode and the conductive layer, an interconnection layer provided in a layer above the conductive layer and below the groove-shape drawn-out electrode, a second contact plug for connecting the interconnection layer and the conductive layer, and a third contact plug for connecting the interconnection layer and the interconnection region. Furthermore, the conductive layer preferably is a gate electrode layer or a landing pad.

Moreover, in the above invention, the connecting structure preferably includes an interconnection layer provided in a layer below the groove-shape drawn-out electrode, a first contact plug for connecting the groove-shape drawn-out electrode and the interconnection layer, and a second contact plug for connecting the interconnection layer with the interconnection region.

Furthermore, in the above invention, the connecting structure preferably includes an interconnection layer provided in a layer below the groove-shape drawn-out electrode and having a lower end portion directly connected to the groove-shape drawn-out electrode, and a contact plug for connecting the interconnection layer with the interconnection region. The interconnection region preferably is an aluminum interconnection layer.

According to another aspect of the semiconductor device based on the present invention, the present semiconductor device is provided with a cell transistor test element group TEG having a cell transistor region and an interconnection region, where the cell transistor region and the interconnection region are disposed in a substantially same region in plan view, and the connecting structure has a contact plug connecting the cylindrical storage node electrode with the interconnection region. The interconnection region preferably is a bit line interconnection layer.

By employing each of the above-described arrangements, reliable electrical contact can be ensured between the cylindrical storage node electrode and the interconnection region so that the measurement of the transistor characteristics can be performed in a stable manner.

According to a further aspect of the semiconductor device based on the present invention, the present semiconductor device is provided with a cell transistor test element group having a cell transistor region and an interconnection region, where the cell transistor region includes a substantially elongate active region, a gate electrode provided in a direction perpendicular to the longitudinal direction of the active region, a bit line that extends in the longitudinal direction of the active region above the gate electrode and that is provided such that it does not overlap the active region in plan view, a landing pad disposed below the interconnection region and connected to the active region, and a contact plug connecting the landing pad with the interconnection region.

According to the above-described arrangement, the electrical connection between the active region and the interconnection region can be ensured via the landing pad and the contact plug. As a result, the interconnection can be drawn out from the active region of the cell transistor so that the measurement of the transistor characteristics can be performed in a stable manner.

According to a still further aspect of the semiconductor device based on the present invention, the present semiconductor device preferably is provided with a cell transistor test element group having a cell transistor region and an interconnection region, where the cell transistor region includes a substantially elongate active region, a gate electrode provided in a direction perpendicular to a longitudinal direction of the active region, and a bit line that extends in the longitudinal direction of the active region above the gate electrode and that is provided such that it does not overlap the active region in plan view, and the interconnection region includes a contact plug that is provided above the cell transistor region with an interlayer film provided therebetween and that connects the interconnection region with the active region. In the above-described invention, the contact plug preferably has a two-part structure.

According to the above-described arrangement, the electrical connection between the active region and the interconnection region can be ensured by the contact plug. As a result, the interconnection can be drawn out from the active region of the cell transistor so that the measurement of the transistor characteristics can be performed in a stable manner.

According to one aspect of the method of manufacturing a semiconductor device based on the present invention, the method of manufacturing a semiconductor device provided with a cell transistor test element group having a cell transistor region and an interconnection region includes the steps of forming the cell transistor region provided with a cylindrical storage node electrode, forming a contact plug connected to the cylindrical storage node electrode, and forming an interconnection region connected to the contact plug.

By producing a semiconductor device from the above steps, the cylindrical storage node electrode and the interconnection region can be reliably connected by the contact plug. As a result, the interconnection can be drawn out from the cylindrical storage node electrode so that the measurement of the transistor characteristics can be performed in a stable manner.

According to another aspect of the method of manufacturing a semiconductor device based on the present invention, the method of manufacturing a semiconductor device provided with a cell transistor test element group having a cell transistor region and an interconnection region includes the steps of forming the cell transistor region including a substantially elongate active region, a gate electrode provided in a direction perpendicular to a longitudinal direction of the active region, and a bit line that extends in the longitudinal direction of the active region above the gate electrode and that is provided such that it does not overlap the active region in plan view; forming an interlayer film covering the cell transistor region; forming a first contact plug and a second contact plug buried in the interlayer film and connected to the active region; and forming the interconnection region contacting the second contact plug on an upper surface of the interlayer film.

By producing a semiconductor device from the above steps, the interconnection region and the active region can be reliably connected by the first and second contact plugs. As a result, the interconnection can be drawn out from the active region so that the measurement of the transistor characteristics can be performed in a stable manner.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
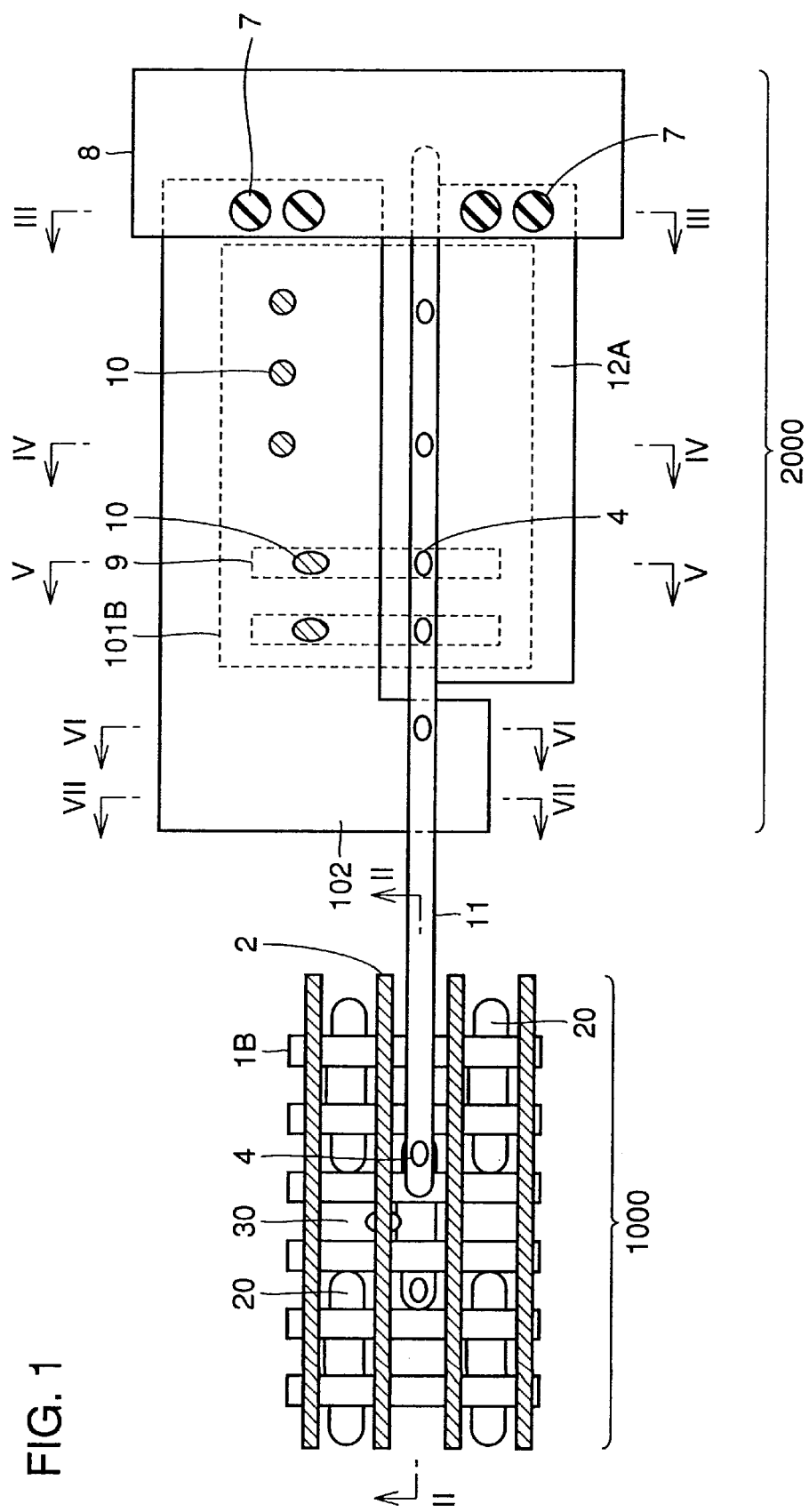
FIG. 1 is a schematic diagram representing a planar structure of a cell transistor TEG having a structure of an interconnection drawn from a storage node electrode according to first to fifth embodiments.

The structures of cell transistor TEGs having various drawn-out interconnection structures according to the embodiments based on the present invention will be described with reference to the drawings. FIG. 1 is a schematic diagram representing a planar structure of a cell transistor TEG having a structure of an interconnection drawn from a storage node electrode according to the first to fifth embodiments described below. In FIG. 1, a region 1000 shows a cell transistor region or a region in which a cell transistor having the same structure as a cell transistor formed in a memory cell of a semiconductor device is formed, and a region 2000 shows an element interconnection region used for the evaluation of cell transistor characteristics. Region 1000 and region 2000 are disposed in different regions in plan view as shown in FIG. 1.

In each of the embodiments described below, a cell plate is provided on the storage node electrode with a dielectric film layer provided therebetween to form a capacitor. The dielectric film layer and the cell plate, however, do not form the essential portion of the present invention, and thus are not shown in the drawings. Moreover, the description of the dielectric film layer and the cell plate is not provided.

First Embodiment

Figure 2:
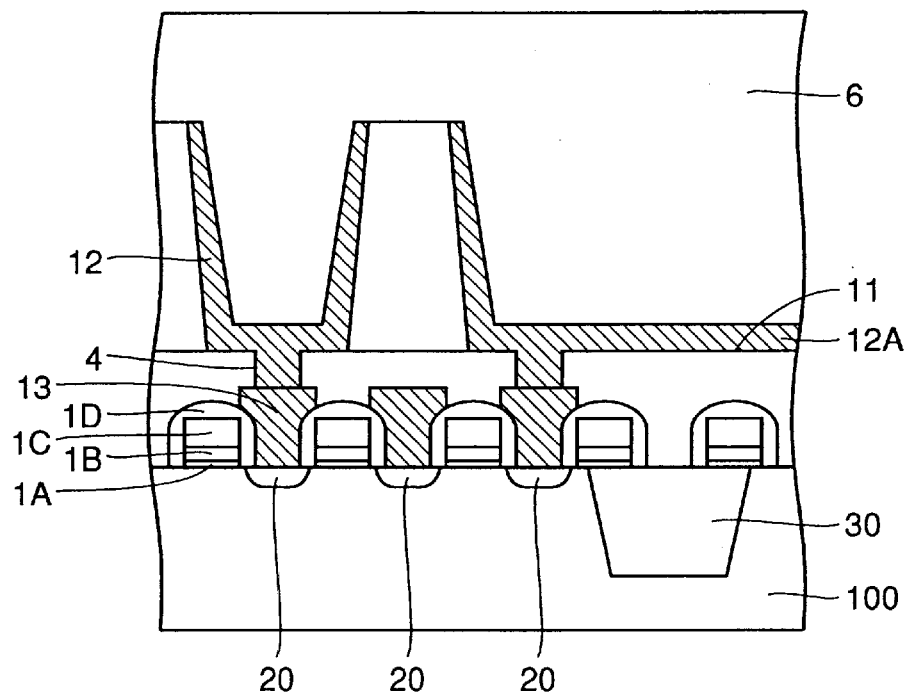
FIG. 2 is a diagram representing a cross sectional structure taken along the line II—II in FIG. 1.
Figure 3:
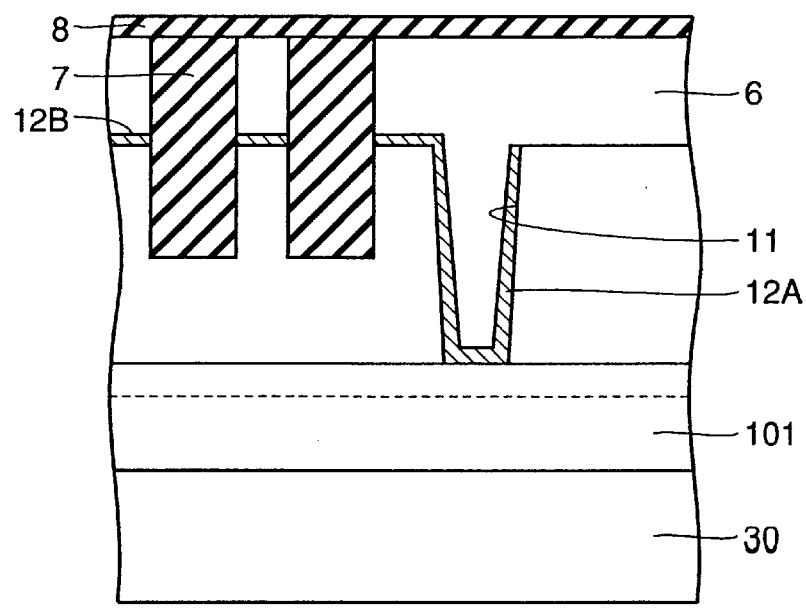
FIG. 3 is a diagram representing a cross sectional structure taken along the line III—III in FIG. 1.

The drawn-out interconnection structure of the cell transistor TEG according to the first embodiment will be described with reference to FIGS. 1 to 3. FIG. 2 is a diagram representing a cross sectional structure taken along the line II—II in FIG. 1, and FIG. 3 is a diagram representing a cross sectional structure taken along the line III—III in FIG. 1.

Arrangement

The structure of region 1000 of the cell transistor TEG will be described in relation to FIGS. 1 and 2. The cell transistor TEG has within a prescribed region on a main surface of a silicon substrate 100 which is a semiconductor substrate a substantially elongate active region 20 separated from another by an element isolating region 30 and defining a source/drain region, a transfer gate 1B provided on silicon substrate 100, with a gate insulating film 1A formed therebetween, along the direction perpendicular to the longitudinal direction of active region 20, and a nitride film 1D and a TEOS film 1C provided so as to cover transfer gate 1B. In addition, above transfer gate 1B, a bit line (BL) 2 made of tungsten or the like is disposed extending along the longitudinal direction of active region 20 such that bit line (BL) 2 and active region 20 do not overlap each other in plan view.

As shown in FIG. 2, a landing pad 13 made of polysilicon or the like is provided to active region 20, and a cylindrical storage node (SN) electrode 12 is connected to landing pad 13 via a storage node contact 4. In addition, a storage node (SN) groove 11 is provided extending in region 2000, and a groove-shape drawn-out electrode 12A made of a doped polysilicon film 50 nm thick is formed on an inner wall of storage node (SN) groove 11.

Now, the structure of region 2000 of the cell transistor TEG will be described with reference to FIGS. 1 and 3. In region 2000 according to this embodiment, an interlayer insulating layer 101 produced in the same step as the above-described gate insulating film 1A, nitride film 1D, and TEOS film 1C is provided above element isolating region 30. Above interlayer insulating layer 101, storage node (SN) groove 11 is provided extending from region 1000, and groove-shape drawn-out electrode 12A formed of a doped polysilicon film that is 50 nm thick is formed on the inner wall of storage node (SN) groove 11. Moreover, an extended pad electrode portion 12B, forming the characteristic structure of this embodiment, made of a 20 nm thick doped polysilicon film extending from groove-shape drawn-out electrode 12A is provided above storage node (SN) groove 11. Groove-shape drawn-out electrode 12A is formed by depositing a 20 nm doped polysilicon thin film, and by etching using a line pattern during the formation of cylindrical storage node (SN) electrode 12.

Further, a contact plug 7 of tungsten is provided which penetrates through extended pad electrode portion 12B and which connects extended pad electrode portion 12B with aluminum interconnection 8 serving as an interconnection region being provided in a layer above extended pad electrode portion 12B and having an interlayer contact film 6 made of a TEOS film provided therebetween.

In this manner, groove-shape drawn-out electrode 12A is drawn out electrically to aluminum interconnection 8 in region 2000. Extended pad electrode portion 12B, contact plug 7, and aluminum interconnection 8 are formed on semiconductor substrate 100 using the DRAM techniques at the same time as the step of forming a memory cell.

Effects and Functions

By employing the drawn-out structure in which groove-shape drawn-out electrode 12A electrically connected to storage node (SN) electrode 12 is drawn to aluminum interconnection 8 in region 2000, groove-shape drawn-out electrode 12A is drawn out to the vicinity of the interconnection region, and to this groove-shape drawn-out electrode 12A, extended pad electrode portion 12B is connected, and contact plug 7 at its sidewalls makes contact with this extended pad electrode portion 12B, thereby electrically connecting contact plug 7 to extended pad electrode portion 12B, even when doped polysilicon film 12 is thin in the cell transistor TEG of a cell transistor employing a cylindrical capacitor structure. Thus, electrical connection between storage node (SN) electrode 12 and aluminum interconnection 8 can be ensured. As a result, the stable measurement of the transistor characteristics becomes possible.

Second Embodiment

Figure 4:
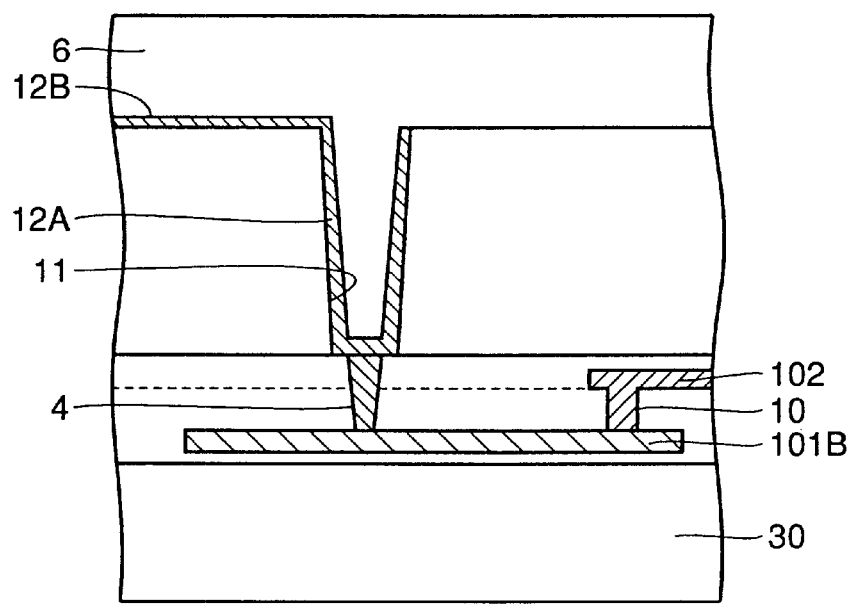
FIG. 4 is a diagram representing a cross sectional structure taken along the line IV—IV in FIG. 2.

Now, the drawn-out interconnection structure of the cell transistor TEG according to the second embodiment will be described in relation to FIGS. 1 to 4. FIG. 4 is a diagram representing a cross sectional structure taken along the line IV—IV in FIG. 1. Moreover, the structure of region 1000 of the cell transistor TEG of the second embodiment is the same as that of the first embodiment so that the structure of region 2000 alone will be described.

Arrangement

The drawn-out structure according to this embodiment will be described in relation to FIG. 4. Below groove-shape drawn-out electrode 12A located in region 2000, a gate electrode layer 101B produced during the same step as transfer gate 1B is disposed, and a contact plug 4 connecting the lower end portion of the groove of groove-shape drawn-out electrode 12A with gate electrode layer 101B is provided.

In a layer above gate electrode layer 101B and below the lower end of groove-shape drawn-out electrode 12A, a bit line layer 102 serving as an interconnection layer produced in the same process step as bit line (BL) 2 is provided, and this bit line layer 102 and gate electrode layer 101B are connected by a contact plug 10. Further, as shown in FIG. 1, bit line layer 102 and aluminum interconnection 8 are connected by contact plug 7.

Effects and Functions

In the above-described arrangement, groove-shape drawn-out electrode 12A can be drawn out to make electrical connection with aluminum interconnection 8 through storage node contact plug 4, gate electrode layer 101B, contact plug 10, bit line layer 102, and contact plug 7, whereby equivalent effects and functions to those attained in the first embodiment can be achieved.

Third Embodiment

Figure 5:
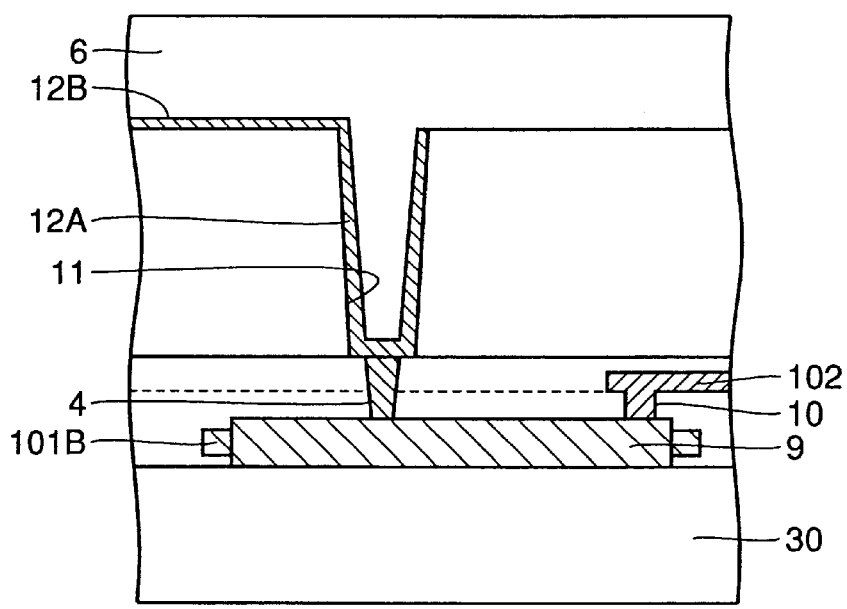
FIG. 5 is a diagram representing a cross sectional structure taken along the line V—V in FIG. 1.

Now, the drawn-out interconnection structure of the cell transistor TEG according to the third embodiment will be described in relation to FIGS. 1 and 5. FIG. 5 is a diagram representing a cross sectional structure taken along the line V—V in FIG. 1. Moreover, the structure of region 1000 of the cell transistor TEG is the same as that in the first embodiment so that the structure of region 2000 alone will be described.

Arrangement

The drawn-out structure according to this embodiment will be described with reference to FIG. 5. Below groove-shape drawn-out electrode 12A located in region 2000, a landing pad 9 formed of polysilicon or the like is formed using a self-aligned contact etching technique between the gate electrodes, and a contact plug 4 is provided connecting the lower end of groove-shape drawn-out electrode 12A to landing pad 9.

In a layer above landing pad 9 and below the lower end of groove-shape drawn-out electrode 12A, a bit line layer 102 serving as an interconnection layer produced in the same process step as bit line (BL) 2 is disposed, and this bit line layer 102 and landing pad 9 are connected by a contact plug 10. Further, as shown in FIG. 1, bit line layer 102 and aluminum interconnection 8 are connected by contact plug 7.

Effects and Functions

In the above-described arrangement, as with the arrangement of the second embodiment, groove-shape drawn-out electrode 12A can be drawn out to make electrical connection with aluminum interconnection 8 through landing pad 9, gate electrode layer 101B, contact plug 10, bit line layer 102, and contact plug 7 so that equivalent effects and functions to those of the first embodiment can be achieved.

Fourth Embodiment

Figure 6:
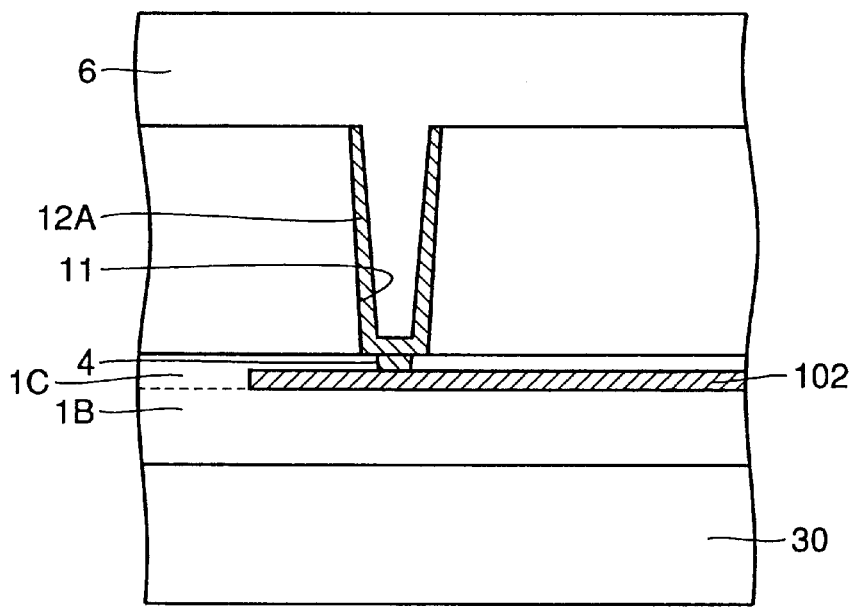
FIG. 6 is a diagram representing a cross sectional structure taken along the line VI—VI in FIG. 1.

Now, the drawn-out interconnection structure of the cell transistor TEG according to the fourth embodiment will be described with reference to FIGS. 1 and 6. FIG. 6 is a diagram representing a cross sectional structure taken along line VI—VI in FIG. 1. Moreover, the structure of region 1000 of the cell transistor TEG is the same as that in the first embodiment so that the structure of region 2000 alone will be described.

Arrangement

The drawn-out structure according to this embodiment will be described in relation to FIG. 6. Below groove-shape drawn-out electrode 12A located in region 2000, a bit line layer 102 serving as an interconnection layer produced during the same process step as bit line (BL) 2 is disposed, and this bit line layer 102 and groove-shape drawn-out electrode 12A are connected by a contact plug 4. Then, as shown in FIG. 1, bit line layer 102 and aluminum interconnection 8 are connected by a contact plug 7.

Effects and Functions

In the above-described arrangement as in the arrangement of the second embodiment, groove-shape drawn-out electrode 12A can be drawn out to make electrical connection with aluminum interconnection 8 through contact plug 4, bit line layer 102, and contact plug 7, whereby equivalent effects and functions to the those of the first embodiment can be achieved.

Fifth Embodiment

Figure 7:
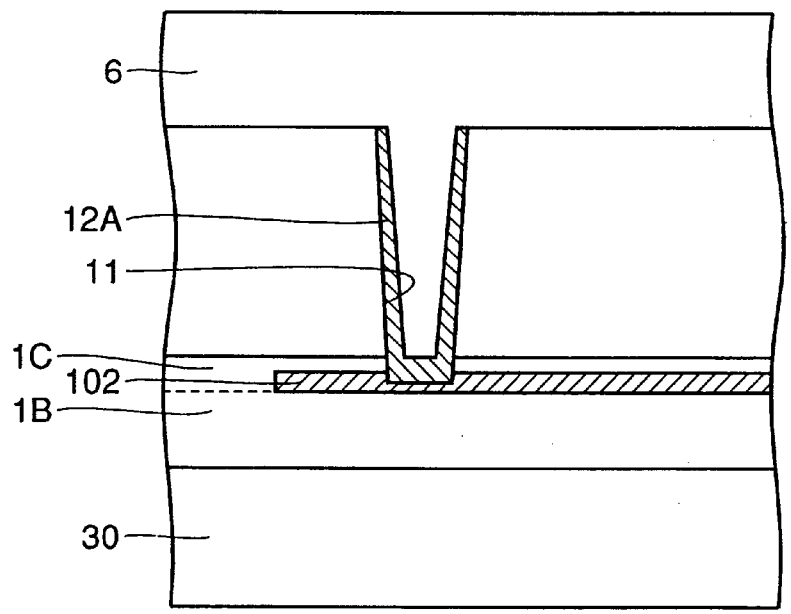
FIG. 7 is a diagram representing a cross sectional structure taken along the line VII—VII in FIG. 1.

Now, the drawn-out interconnection structure of the cell transistor TEG according to the fifth embodiment will be described in relation to FIGS. 1 and 7. FIG. 7 is a diagram representing a cross sectional structure taken along the line VII—VII in FIG. 1. Moreover, the structure of region 1000 of the cell transistor TEG is the same as that in the first embodiment so that the structure of region 2000 alone will be described.

Arrangement

The drawn-out structure according to this embodiment will be described in relation to FIG. 7. Below groove-shape drawn-out electrode 12A located in region 2000, a bit line layer 102 serving as an interconnection layer produced during the same process step as bit line (BL) 2 is disposed, and the lower end portion of groove-shape drawn-out electrode 12A is directly connected to this bit line layer 102. Further, as shown in FIG. 1, bit line layer 102 and aluminum interconnection 8 are connected by contact plug 7.

Moreover, since storage node (SN) groove 11 has a larger area of opening than the contact hole of contact plug 4 formed in the above-described embodiments, the etching rate is faster so that it becomes difficult in some cases to control etching so as to keep from over-etching the interlayer BPTEOS film on bit line layer 102. Thus, instead of attempting the control, this embodiment involves etching of storage node (SN) groove 11 until it has reached bit line layer 102.

Effects and Functions

In the above-described arrangement, as in the arrangement of the second embodiment, groove-shape drawn-out electrode 12A can be drawn out to make electrical connection with aluminum interconnection 8 through bit line layer 102 and contact plug 7, whereby equivalent effects and functions to the those of the first embodiment can be attained.

Sixth Embodiment

The combination of five different drawn-out structures according to the above-described first to fifth embodiments can be applied to region 2000 as shown in the planar structure of FIG. 1 so as to allow a more stable measurement of the transistor characteristics and reduction in the interconnection resistance and the contact resistance.

Seventh Embodiment

Figure 8:
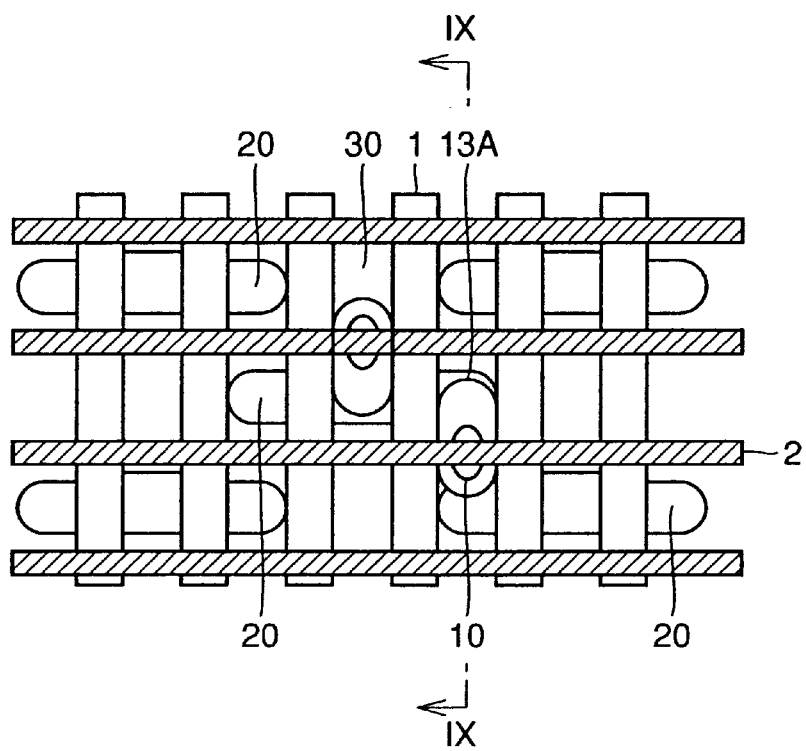
FIG. 8 is a schematic diagram representing a planar structure of a cell transistor TEG according to the seventh embodiment.
Figure 9:
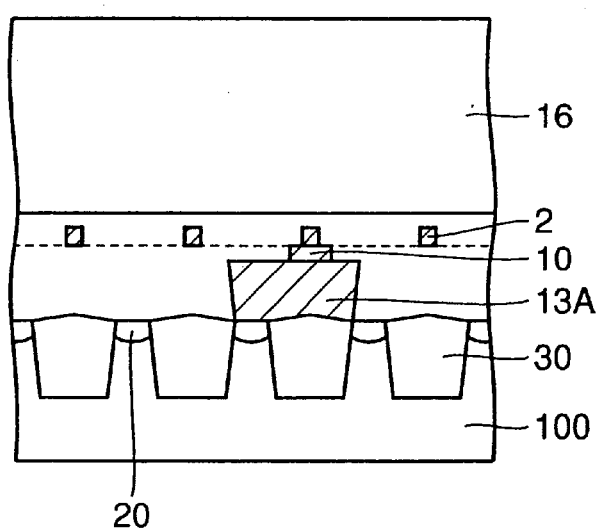
FIG. 9 is a diagram representing a cross sectional structure taken along the line IX—IX in FIG. 8.

Now, the drawn-out interconnection structure of the cell transistor TEG according to the seventh embodiment will be described in relation to FIGS. 8 and 9. FIG. 8 is a schematic diagram representing a planar structure of the cell transistor TEG, and FIG. 9 is a diagram representing a cross sectional structure taken along the line IX—IX in FIG. 8.

Arrangement

The structure of the cell transistor TEG will be described with reference to FIGS. 8 and 9. The cell transistor TEG is provided which has within a prescribed region on a main surface of a silicon substrate 100 which is a semiconductor substrate a substantially elongate active region 20A separated from another by an element isolating region 30 and defining a source/drain region, and a transfer gate 1B provided on silicon substrate 100, with a gate insulating film 1A formed therebetween, along the direction perpendicular to the longitudinal direction of active region 20A. In addition, above transfer gate 1B, a bit line (BL) 2 made of tungsten or the like is disposed extending along the longitudinal direction of active region 20A such that bit line (BL) 2 and active region 20A do not overlap each other in plan view.

A landing pad 13A made of polysilicon or the like is provided to active region 20A during the same manufacturing process step as the bit line contact and the storage node contact, and further, bit line (BL) 2 is connected to landing pad 13A via contact plug 10. Landing pad 13A has a short narrow strip shape that extends in the same direction as transfer gate 1B.

Effects and Functions

With this structure, the cell transistor characteristics can be measured by utilizing the active region of the cell transistor via landing pad 13A, contact plug 10, and bit line (BL) 2. Moreover, the interconnection resistance and the contact resistance can be reduced. Furthermore, since the measurement of the cell transistor characteristics becomes possible after the formation of bit lien (BL) 2, the number of manufacturing process steps for the cell transistor TEG can also be reduced.

Eighth Embodiment

Figure 10:
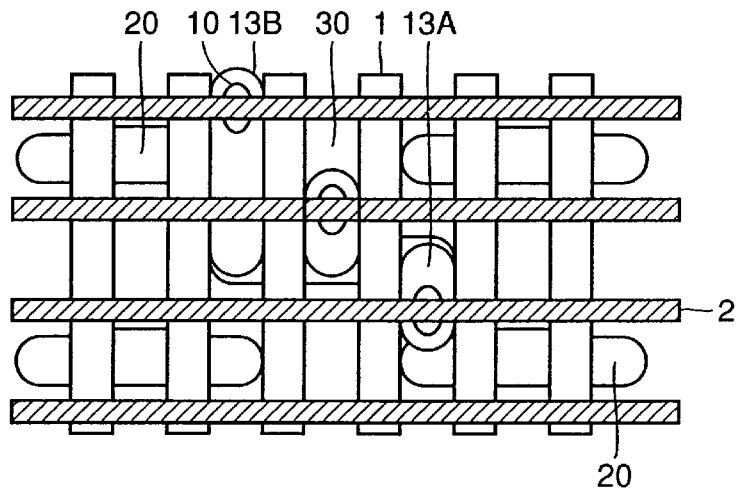
FIG. 10 is a schematic diagram representing a planar structure of a cell transistor TEG according to the eighth embodiment.

Now, the drawn-out interconnection structure of the cell transistor TEG according to the eighth embodiment will be described in relation to FIG. 10. FIG. 10 is a schematic diagram representing a planar structure of the cell transistor TEG.

Arrangement

The drawn-out interconnection structure of the cell transistor TEG according to the eighth embodiment is basically the same as the drawn-out interconnection structure of the cell transistor TEG according to the above-described seventh embodiment. The difference is that, as shown in FIG. 10, a landing pad 13B formed to have a longer length than landing pad 13A in the direction of transfer gate 1B extension is provided. By providing landing pad 13B, bit line (BL) 2 and an active region 20B which is positioned farther away from active region 20A can be connected.

Effects and Functions

Equivalent effects and functions to those attained by the drawn-out interconnection structure in the above-described seventh embodiment can be achieved with the above-described arrangement.

Ninth Embodiment

Figure 11:
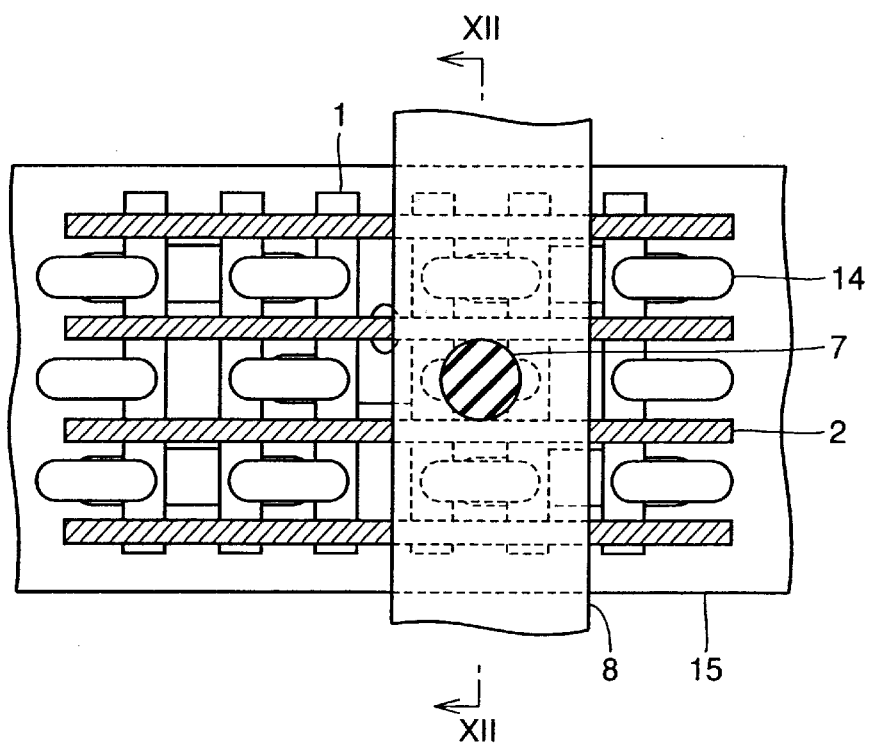
FIG. 11 is a schematic diagram representing a planar structure of a cell transistor TEG according to the ninth embodiment.

Now, the drawn-out interconnection structure of the cell transistor TEG according to the ninth embodiment will be described in relation to FIGS. 11 and 12. FIG. 11 is a schematic diagram representing a planar structure of the cell transistor TEG, and FIG. 12 is a diagram representing a cross sectional structure taken along the line XII—XII in FIG. 11.

Figure 12:
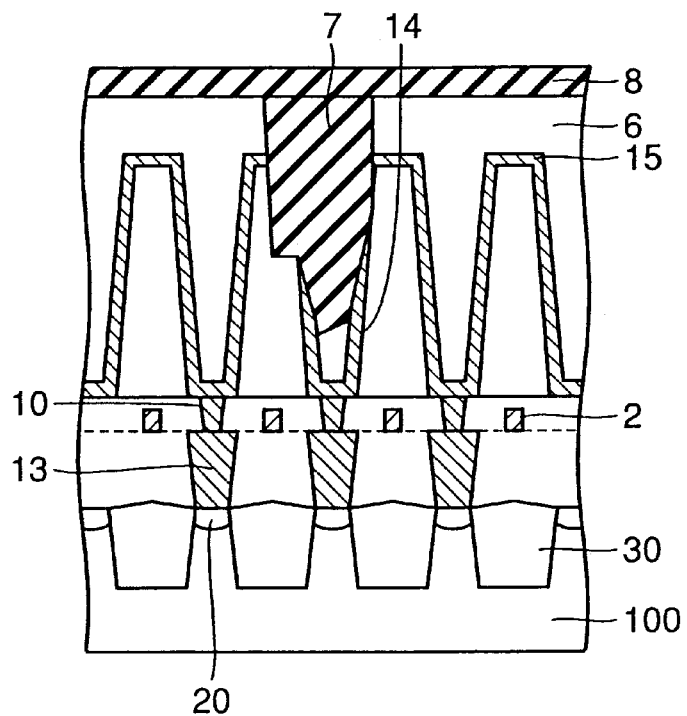
FIG. 12 is a diagram representing a cross sectional structure taken along the line XII—XII in FIG. 11.

As shown in FIGS. 11 and 12, the cell transistor TEG has within a prescribed region on a main surface of a silicon substrate 100 which is a semiconductor substrate a substantially elongate active region 20 separated from another by an element isolating region 30 and defining a source/drain region, and a transfer gate 1B provided on silicon substrate 100, with a gate insulating film formed therebetween, along the direction perpendicular to the longitudinal direction of active region 20. In addition, above transfer gate 1B, a bit line (BL) 2 made of tungsten or the like is disposed extending along the longitudinal direction of active region 20 such that bit line (BL) 2 and active region 20 do not overlap each other in plan view.

As shown in FIG. 12, a landing pad 13 made of polysilicon or the like is provided to active region 20, and a cylindrical storage node (SN) electrode 15 provided on a sidewall of a storage node (SN) groove 14 is connected to landing pad 13 via a storage node contact plug 10. Cylindrical storage node (SN) electrode 15 is covered by an interlayer contact film 6 having a planarized surface, and aluminum interconnection 8 is provided in a layer above interlayer contact film 6. In addition, a contact plug 7 is provided for connecting cylindrical storage node (SN) electrode 15 and aluminum interconnection 8.

Manufacturing Method

Now, the method of manufacturing the cell transistor TEG having the above-described arrangement will be described with reference to FIGS. 13 to 16. FIGS. 13 to 16 are cross sectional views showing the manufacturing process steps according to the cross sectional structure of the cell transistor TEG shown in FIG. 12.

Figure 13:
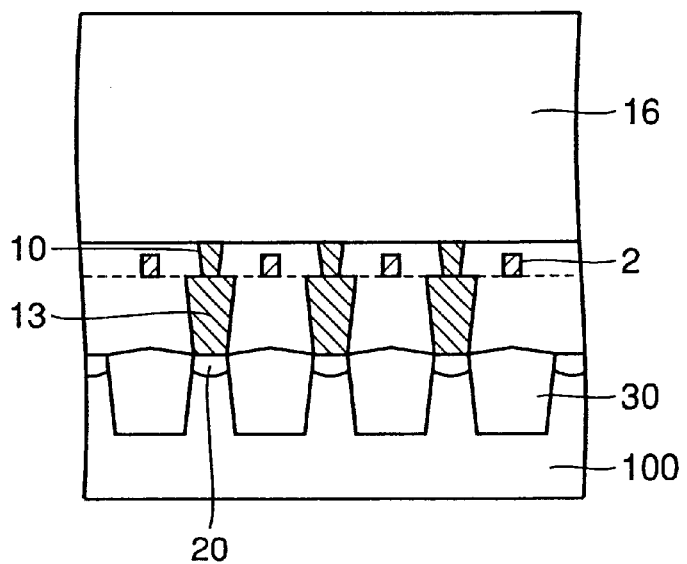
FIGS. 13 to 16 are cross sectional views of first to fourth process steps showing the method of manufacturing the cell transistor TEG in the ninth embodiment.

As shown in FIG. 13, an element isolating region 30, an active region 20 defining a source/drain region, a transfer gate 1B, a bit line (BL) 2, a landing pad 13 formed of polysilicon or the like, and a storage node contact 10 are formed within a prescribed region of the main surface of a silicon substrate 100 using the DRAM manufacturing techniques. Thereafter, an interlayer contact film 16 having a thickness of 1700 nm is deposited in a layer above storage node contact 10.

Figure 14:
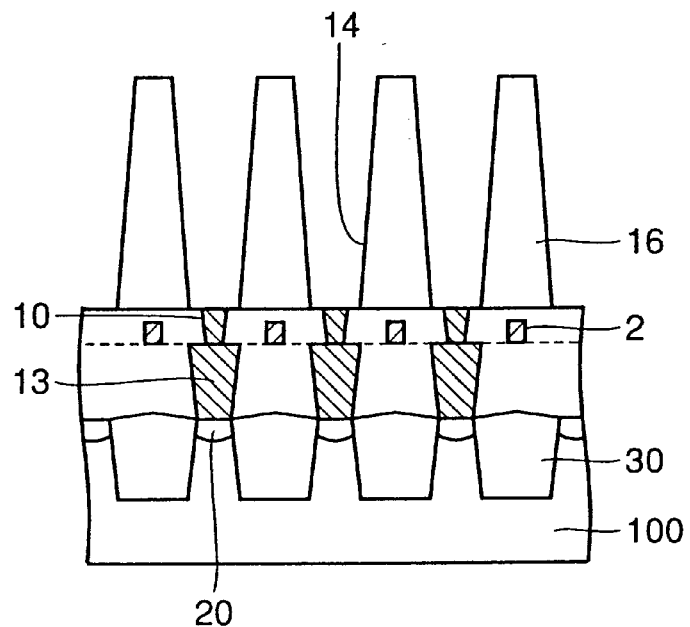
Figure 15:
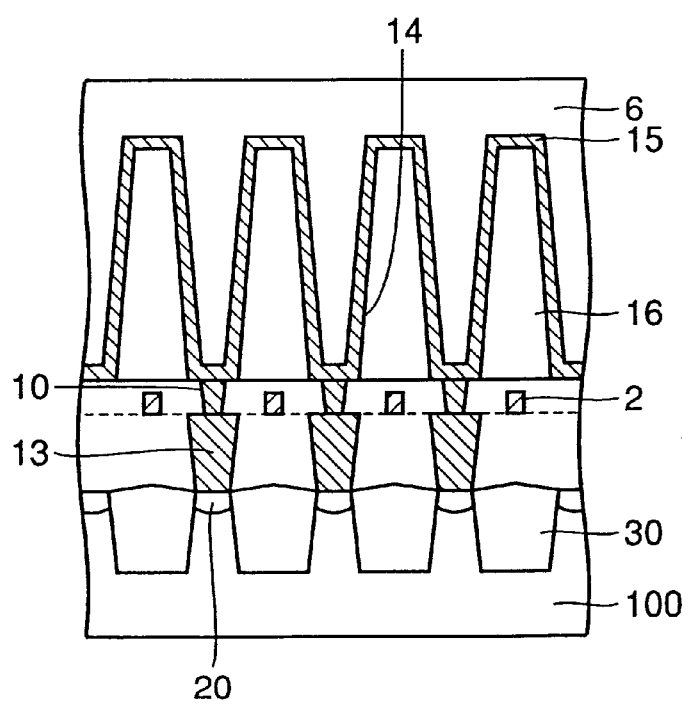

Then, as shown in FIG. 14, by photolithography using dry etching, interlayer contact film 16 is patterned to form a storage node (SN) groove 14. Thereafter, as shown in FIG. 15, doped polysilicon is deposited to the thickness of 50 nm on the inner wall of storage node (SN) groove 14 to form a cylindrical storage node (SN) electrode 15. Then, a TEOS film 300 nm thick is deposited on cylindrical storage node (SN) electrode 15 to form an interlayer contact film 6.

Figure 16:
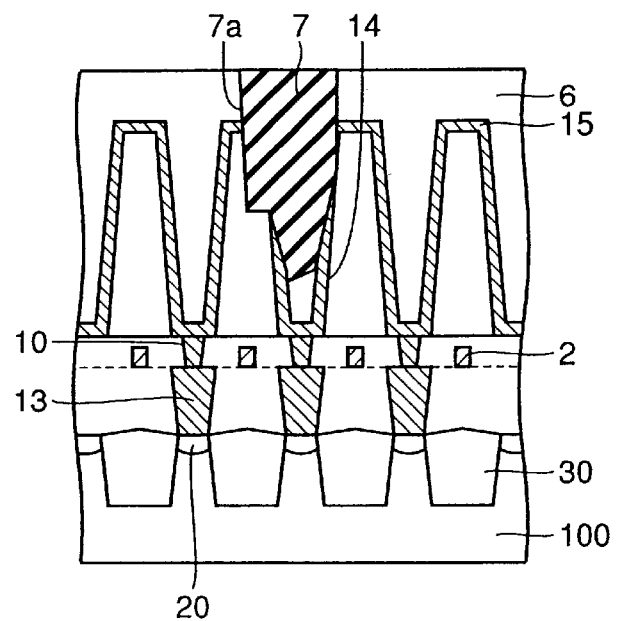

As shown in FIG. 16, after the upper surface of interlayer contact film 6 is planarized, an opening pattern is formed using photolithography, and then, a contact hole 7a leading to cylindrical storage node (SN) electrode 15 is formed in interlayer contact film 6 by dry etching. Thereafter, a barrier metal film of titanium nitride is deposited in contact hole 7a, and then tungsten is deposited. Then, tungsten on interlayer contact film 6 is removed by dry etching to complete contact plug 7. Thereafter, an aluminum layer is deposited on the surface of interlayer contact film 6, and is patterned by photolithography so as to form aluminum interconnection 8 as shown in FIG. 12.

Effects and Functions

With the structure and the manufacturing method of the cell transistor TEG according to the above-described ninth embodiment, when contact hole 7a is formed by etching, since the etching rate of cylindrical storage node (SN) electrode 15 is slower than the etching rate of interlayer contact film 6, the etching would not be effected as far as to bit line (BL) 2 so that short-circuiting of cylindrical storage node (SN) electrode 15 and bit line (BL) 2 can be prevented even when the alignment of contact hole 7a is displaced.

Moreover, since the electrical contact between cylindrical storage node (SN) electrode 15 and aluminum interconnection 8 can be ensured with this drawn-out structure, the measurement of transistor characteristics can be performed in a stable manner. Furthermore, a region such as one in which region 2000 shown in FIG. 1 is formed is not required so that the planar dimension of the cell transistor TEG can be kept small.

Tenth Embodiment

Figure 17:
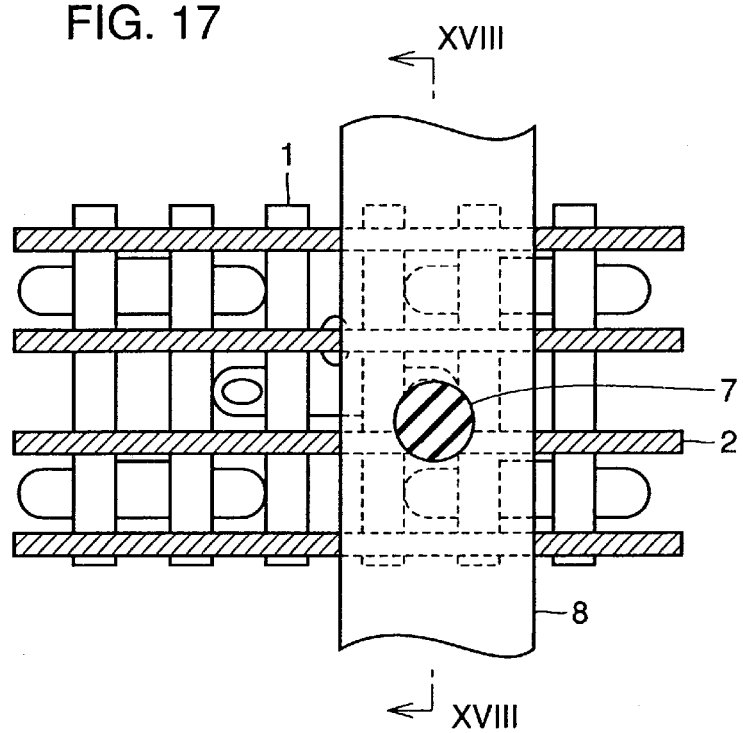
FIG. 17 is a schematic diagram representing a planar structure of a cell transistor TEG according to the tenth embodiment.

The drawn-out interconnection structure of the cell transistor TEG according to the tenth embodiment will be described with reference to FIGS. 17 and 18. FIG. 17 is a schematic diagram representing a planar structure of the cell transistor TEG, and FIG. 18 is a diagram representing a cross sectional structure taken along the line XVIII—XVIII in FIG. 17.

Figure 18:
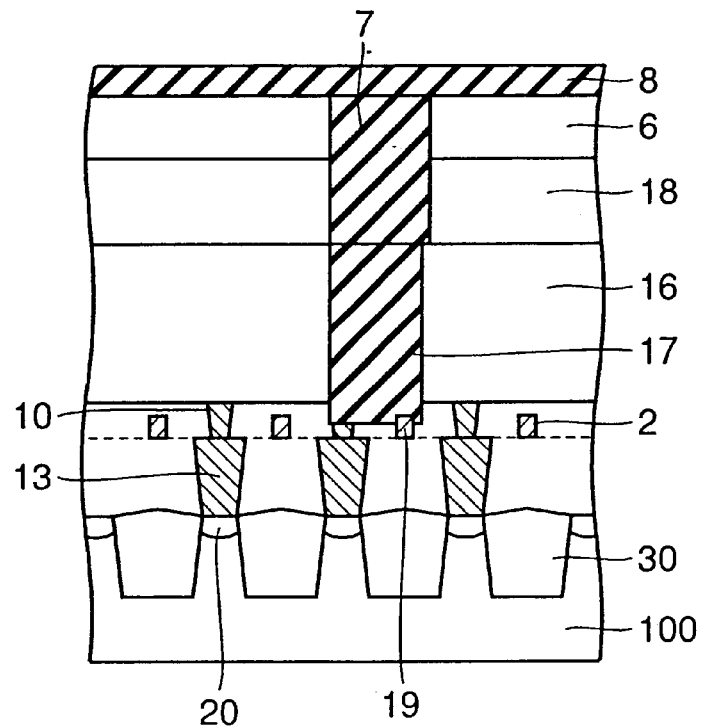
FIG. 18 is a diagram representing a cross sectional structure taken along the line XVIII—XVIII in FIG. 17.

As seen in FIGS. 17 and 18, the cell transistor TEG has within a prescribed region on a main surface of a silicon substrate 100 which is a semiconductor substrate a substantially elongate active region 20 separated from another by an element isolating region 30 and defining a source/drain region, and a transfer gate 1B provided on silicon substrate 100, with a gate insulating film formed therebetween, along the direction perpendicular to the longitudinal direction of active region 20. In addition, above transfer gate 1B, a bit line (BL) 2 and a dummy bit line 19 made of tungsten or the like is disposed extending along the longitudinal direction of active region 20 such that bit line (BL) 2 and dummy bit line 19 do not overlap active region 20 in plan view.

As shown in FIG. 18, a landing pad 13 made of polysilicon or the like is provided to active region 20. In a layer above landing pad 13, a first interlayer contact film 16 is provided. On first interlayer contact film 16, a second interlayer contact film 18 is provided. Further, on second interlayer contact film 18, a third interlayer contact film 6 is provided.

Aluminum interconnection 8 is provided above third interlayer contact film 6. A first contact plug 17 and a second contact plug 7 connecting aluminum interconnection 8 to landing pad 13 and dummy bit line 19 are provided.

Manufacturing Method

Now, the method of manufacturing the cell transistor TEG having the above-described arrangement will be described with reference to FIGS. 19 to 22. FIGS. 19 to 22 are cross sectional views of the manufacturing process steps according to the cross sectional structure of the cell transistor TEG shown in FIG. 18.

Figure 19:
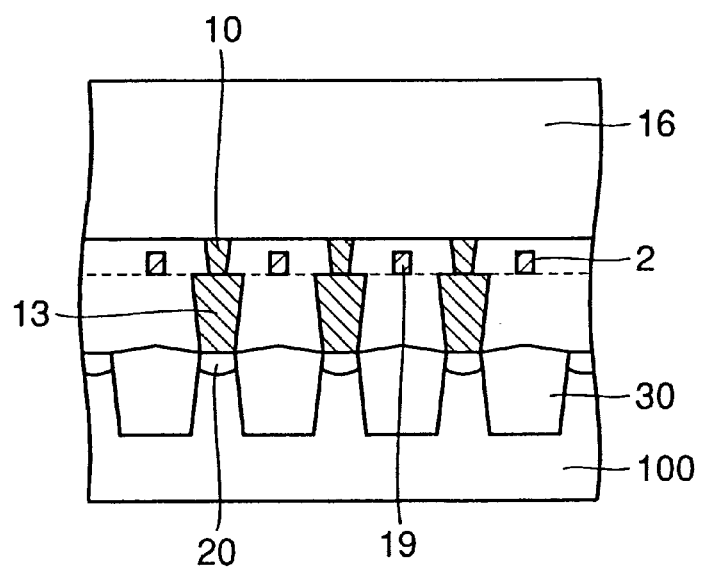
FIGS. 19 to 22 are cross sectional views of first to fourth process steps showing the method of manufacturing the cell transistor TEG in the tenth embodiment.

As shown in FIG. 19, an element isolating region 30, an active region 20 defining a source/drain region, a transfer gate 1B, a bit line (BL) 2, a dummy bit line 19, a landing pad 13 formed of polysilicon or the like, and a contact plug 10 are formed within a prescribed region of the main surface of a silicon substrate 100 using the DRAM manufacturing techniques. Then, first interlayer contact film 16 having a thickness of 1000 nm is deposited in a layer above contact plug 10.

Figure 20:
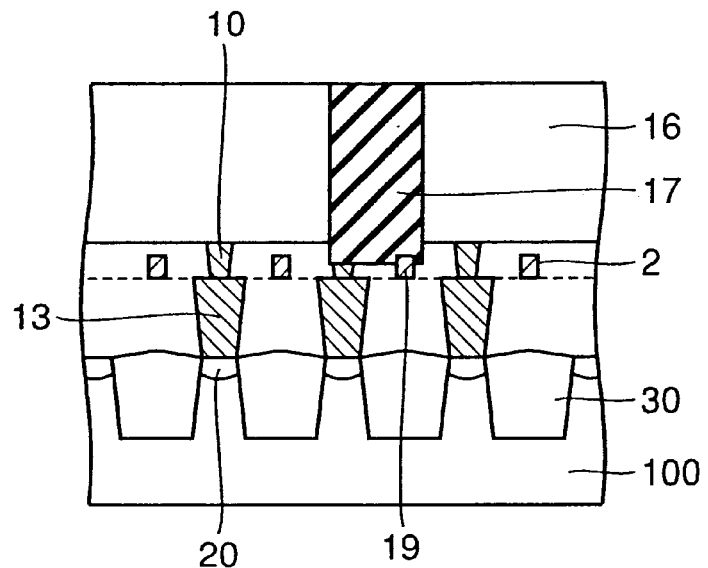

Then, as shown in FIG. 20, a contact hole is formed in first interlayer contact film 16 using photolithography. At this time, the etching of first interlayer contact film 16 is controlled such that the etching stops at the surface of dummy bit line 19. A barrier metal film of titanium nitride is deposited in the contact hole, and then tungsten is deposited. Thereafter, the CMP (Chemical Mechanical Polishing) process is performed on the tungsten on interlayer contact film 6 to planarize the surfaces of first interlayer contact film 16 and first contact plug 17, thereby completing first contact plug 17.

Figure 21:
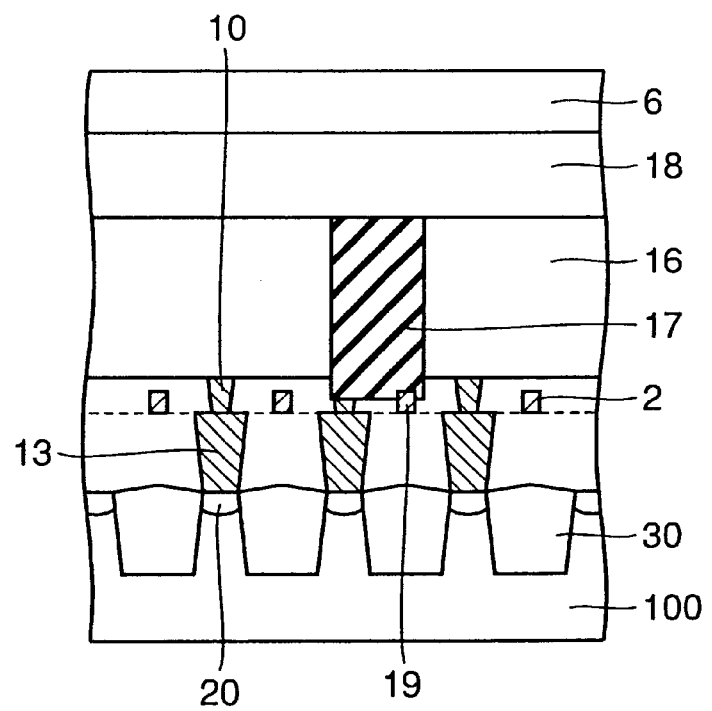

Then, as shown in FIG. 21, a BPTEOS film is deposited to the thickness of 700 nm on the surfaces of first interlayer contact film 16 and first contact plug 17 to form a second interlayer contact film 18, and thereafter, a third interlayer contact film 6 is deposited thereon.

Figure 22:
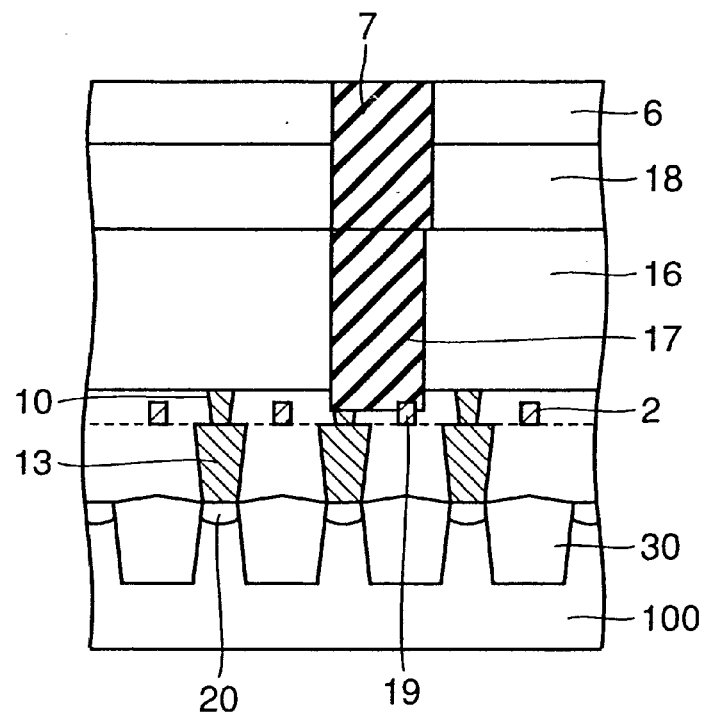
Figure 23:
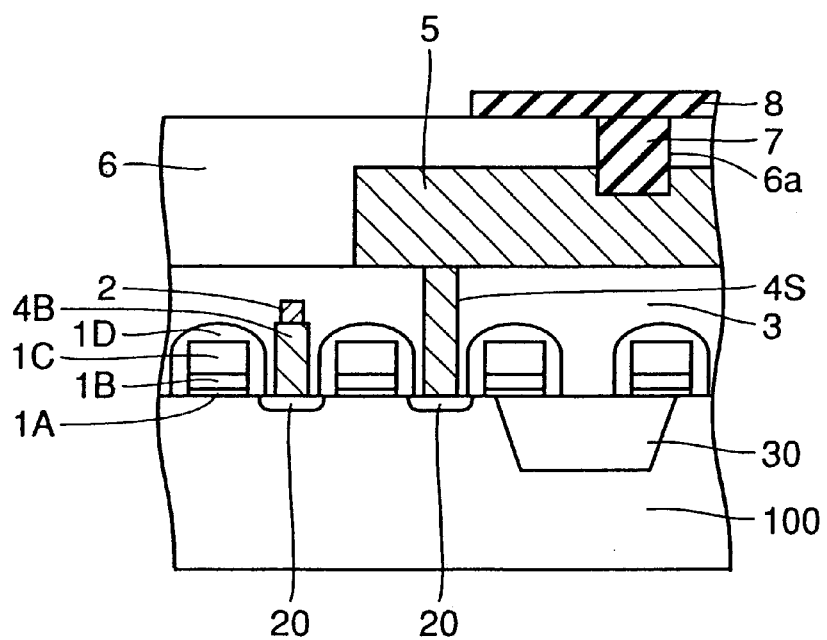
FIG. 23 is a diagram showing a cross sectional structure of a prior art cell transistor TEG.

As shown in FIG. 22, a contact hole is formed in second interlayer contact film 18 and third interlayer contact film 6 using photolithography. At this time, the etching of second interlayer contact film 18 is controlled such that the etching stops at the surface of first contact plug 17. A barrier metal film of titanium nitride is deposited in the contact hole, and then tungsten is deposited. Thereafter, the CMP process is performed on the tungsten on third interlayer contact film 6 to planarize the surfaces of third interlayer contact film 6 and second contact plug 7, thereby completing second contact plug 7. Then, an aluminum layer is deposited on the surface of third interlayer contact film 6, and is patterned by photolithography so as to form aluminum interconnection 8 as shown in FIG. 18.

Effects and Functions

With the structure and the manufacturing method of the cell transistor TEG according to the above-described tenth embodiment, the interlayer contact film deposition is performed more than once, and first contact plug 17 is formed when first interlayer contact film 16 is formed so that first contact plug 17 can be positioned accurately in making contact with contact plug 10.

Moreover, since the electrical contact between active region 20 and aluminum interconnection 8 can be ensured with this drawn-out structure, the measurement of transistor characteristics can be performed in a stable manner. Furthermore, a region such as one in which region 2000 shown in FIG. 1 is formed is not required so that the planar dimension of the cell transistor TEG can be kept small.

With the semiconductor device and the manufacturing method thereof according to the present invention, the reliable contact to the interconnection regions can be ensured so that a stable measurement of the transistor characteristics becomes possible using a test element group.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device provided with a cell transistor test element group having a cell transistor region and an interconnection region and provided with a connecting structure for electrically connecting said interconnection region with a cylindrical storage node electrode provided in said cell transistor region, wherein
    said cell transistor region and said interconnection region are disposed in different regions in plan view, said semiconductor device further comprising:
        a groove portion provided extending from said cell transistor region to said interconnection region; and
        a groove-shape drawn-out electrode provided along a sidewall of said groove portion;
        wherein said interconnection region is an aluminum interconnection layer.

2. The semiconductor device according to claim 1, wherein said connecting structure includes
    an extended pad electrode portion extending from said groove-shape drawn-out electrode above said groove portion, and
    a contact plug which penetrates through said extended pad electrode portion and which connects said extended pad electrode portion with said interconnection region provided in a layer above said groove-shape drawn-out electrode.

3. The semiconductor device according to claim 1, wherein said connecting structure includes
    a conductive layer disposed in a layer below said groove-shape drawn-out electrode,
    a first contact plug for connecting said groove-shape drawn-out electrode and said conductive layer,
    an interconnection layer provided in a layer above said conductive layer and below said groove-shape drawn-out electrode,
    a second contact plug for connecting said interconnection layer and said conductive layer, and
    a third contact plug for connecting said interconnection layer and said interconnection region.

4. The semiconductor device according to claim 3, wherein said conductive layer is a gate electrode layer or a landing pad.

5. The semiconductor device according to claim 1, wherein said connecting structure includes
    an interconnection layer provided in a layer below said groove-shape drawn-out electrode,
    a first contact plug for connecting said groove-shape drawn-out electrode and said interconnection layer, and
    a second contact plug for connecting said interconnection layer and said interconnection region.

6. The semiconductor device according to claim 1, wherein said connecting structure includes
    an interconnection layer provided in a layer below said groove-shape drawn-out electrode and having a lower end portion directly connected to said groove-shape drawn-out electrode, and
    a contact plug for connecting said interconnection layer and said interconnection region.

7. A semiconductor device provided with a cell transistor test element group having a cell transistor region and an interconnection region and provided with a connecting structure for electrically connecting said interconnection region with a cylindrical storage node electrode provided in said cell transistor region, wherein
    said cell transistor region and said interconnection region are disposed in a substantially same region in plan view,
    said connecting structure has a contact plug connecting said cylindrical storage node electrode and said interconnection region, and
    said interconnection region is an aluminum interconnection layer.

8. The semiconductor device according to claim 7, wherein said interconnection region is a bit line interconnection layer.

9. A semiconductor device provided with a cell transistor test element group having a cell transistor region and an interconnection region, wherein said cell transistor region includes
    a substantially elongate active region,
    a gate electrode provided in a direction perpendicular to a longitudinal direction of said active region, and
    a bit line that extends in the longitudinal direction of said active region above said gate electrode and that is provided such that it does not overlap said active region in plan view, wherein
        said interconnection region includes a contact plug that is provided above said cell transistor region with an interlayer film provided therebetween and that connects said interconnection region and said active region, and
        said interconnection region is an aluminum interconnection layer.

10. The semiconductor device according to claim 9, wherein said contact plug has a two-part structure.

* * * * *